United States Patent
Meadows et al.

(10) Patent No.: US 6,768,367 B1
(45) Date of Patent: Jul. 27, 2004

(54) PRE-BIASED VOLTAGE LEVEL SHIFTING CIRCUIT FOR INTEGRATED CIRCUIT DEVICES UTILIZING DIFFERING POWER SUPPLY LEVELS

(75) Inventors: Harold Brett Meadows, Colorado Springs, CO (US); Jon Allan Faue, Colorado Springs, CO (US)

(73) Assignee: ProMOS Technologies, Inc., Hsinchu (TW)

(*) Notice: Subject to any disclaimer, the term of this patent is extended or adjusted under 35 U.S.C. 154(b) by 0 days.

(21) Appl. No.: 10/352,721

(22) Filed: Jan. 28, 2003

(51) Int. Cl.$^7$ ................................................ H03L 5/00
(52) U.S. Cl. .................... 327/333; 327/108; 326/80; 326/81
(58) Field of Search ............................. 327/108, 112, 327/333, 427, 434, 581; 326/68, 80, 81, 83

(56) References Cited

U.S. PATENT DOCUMENTS

| | | | |
|---|---|---|---|
| 4,574,273 A | * | 3/1986 | Atsumi et al. ............... 326/81 |
| 5,151,622 A | * | 9/1992 | Thrower et al. ............... 326/83 |
| 5,317,213 A | * | 5/1994 | Sato et al. ..................... 326/68 |
| 5,650,742 A | * | 7/1997 | Hirano ........................ 327/333 |
| 6,084,430 A | * | 7/2000 | Wayner ........................ 326/80 |
| 6,480,050 B1 | * | 11/2002 | Barnes ........................ 327/333 |
| 6,509,772 B1 | * | 1/2003 | Ye et al. ..................... 327/211 |
| 6,559,691 B2 | * | 5/2003 | Mawatari et al. ........... 327/108 |

* cited by examiner

*Primary Examiner*—Long Nguyen
(74) *Attorney, Agent, or Firm*—William J. Kubida; Peter J. Meza; Hogan & Hartson LLP (57) ABSTRACT

A pre-biased voltage level shifting circuit of especial applicability with respect to those integrated circuit devices requiring a technique for converting circuit operation between differing power supply levels. In a representative embodiment, the circuit utilizes feedback to make the switching transistors faster to thereby increase the speeds of the level translation of signals based upon two different power supplies.

26 Claims, 5 Drawing Sheets

PRE-BIASED VOLTAGE LEVEL SHIFTING CIRCUIT FOR INTEGRATED CIRCUIT DEVICES UTILIZING DIFFERING POWER SUPPLY LEVELS

BACKGROUND OF THE INVENTION

The present invention relates, in general, to the field of integrated circuit ("IC") devices. More, particularly, the present invention relates to a pre-biased voltage level shifting circuit of especial applicability with respect to those ICs requiring a technique for converting circuit operation between differing power supply levels.

When different power supplies are required in a circuit, a means of transitioning between the differing supplies is required. With existing circuit techniques, the primary deficiency in operation is the speed at which the level translation occurs between signals based on the two different power supplies.

Certain conventional circuit implementations not only exhibit operational speed problems but can also waste power due to undesired current flow between a given power supply input and circuit ground. In other circuits a "fight" condition can exist between transistors such that level shifting is slower intone direction (e.g. from "high" to "low") than the other. Regardless of circuit design, existing level shifting schemes exhibit a negative impact on circuit speed performance.

SUMMARY OF THE INVENTION

Disclosed herein is a pre-biased voltage level shifting circuit of especial applicability with respect to those integrated circuit devices requiring a technique for converting circuit operation between differing power supply levels. In a representative embodiment, the circuit utilizes feedback to make the switching transistors faster to thereby increase the speed of the level translation of signals based upon two different power supplies.

Particularly disclosed herein is a voltage level shifting circuit having first and second supply voltage level inputs thereto. The circuit comprises a first switching device coupling a first circuit node to a second circuit node, with the first switching device having a control terminal coupled to the first supply voltage level input. Second and third switching devices are coupled between the second supply voltage level input and a third circuit node and a fourth switching device is coupled between the third circuit node and the second circuit node. Fifth and sixth series coupled switching devices are coupled between the second supply voltage level input and a reference voltage input and define a fourth circuit node therebetween. A control terminal of the fifth switching device is coupled to the second circuit node and a control terminal of the sixth switching device is coupled to the first circuit node. Seventh and eighth series coupled switching devices are coupled between the second supply voltage level input and the fourth circuit node with a control terminal of the eighth switching device being coupled to the second circuit node. A first circuit delay block couples the fourth circuit node to a control terminal of the, seventh switching device and a second circuit delay block couples the control terminal of the seventh switching device to a control terminal of the third switching device.

Further disclosed herein is a voltage level shifting circuit comprising an input node for receiving an input signal transitioning between a reference voltage level and a first voltage level. The circuit further comprises an output node for providing a complementary output signal transitioning between a second voltage level and the reference voltage level. An intermediate node is coupled between the input and output nodes and has a state thereof which tracks a state of the input signal. A feedback circuit having a feedback node thereof is coupled to the output node and has a state thereof which corresponds to that of the output node. In a particular embodiment disclosed herein, the voltage level shifting circuit may comprise an additional feedback circuit having another feedback node thereof coupled to the intermediate node and having a state thereof which corresponds to that of the intermediate node.

BRIEF DESCRIPTION OF THE DRAWINGS

The aforementioned and other features and objects of the present invention and the manner of attaining them will become more apparent and the invention; itself will be best understood by reference to the following description of a preferred embodiment taken in conjunction with the accompanying drawings, wherein.

DESCRIPTION OF A REPRESENTATIVE EMBODIMENT

Figure 1:
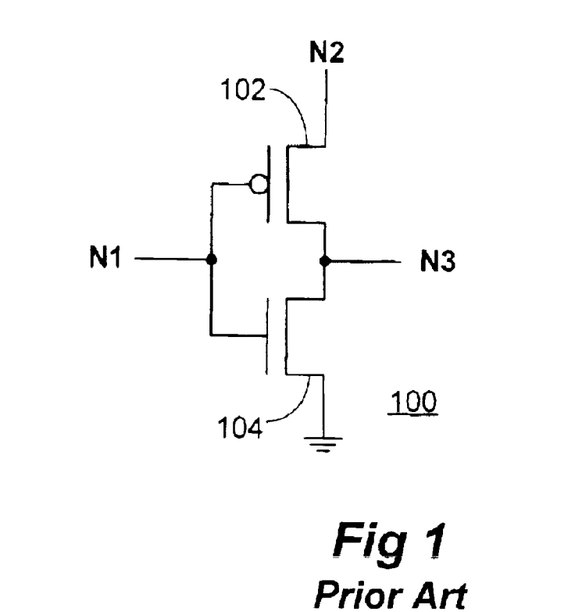
FIG. 1 is a schematic diagram of a prior art voltage level shifting circuit.

With reference now to FIG. 1, a schematic diagram of a prior art voltage level shifting circuit 100 is shown. The circuit 100 comprises a P-channel transistor 102 in series with an N-channel transistor 102 coupled between a node N2 and circuit ground ([[VSS]]) $V_{SS}$. The gates of the transistors 102 and 104 are connected to node N1 and the point intermediate the two devices defines a node N3.

In operation, if the node N1 voltage [V(N1)], when at a "high" logic level, is less than the voltage on node N2 [V(N2)], P-channel transistor 102 may not turn "off" when transistor 104 is turned "on". In this situation, current can flow from node N2 to circuit ground, thus wasting power.

Figure 2:
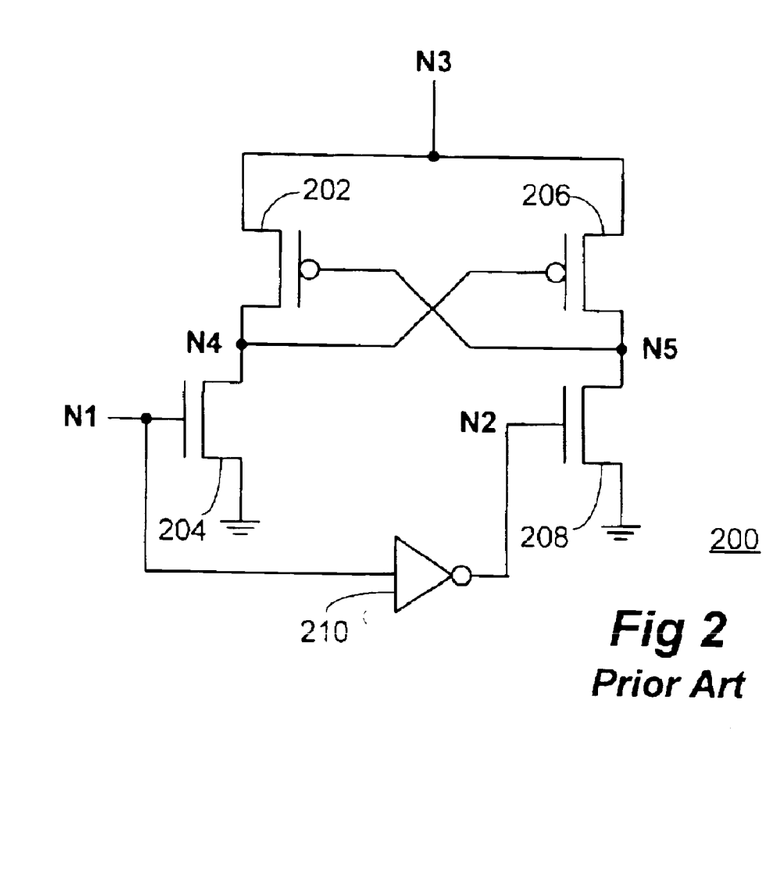
FIG. 2 is a schematic diagram of another prior art voltage level shifting circuit.

With reference now to FIG. 2, a schematic diagram of another prior art voltage level shifting circuit 200 is shown. The circuit 200 comprises P-channel transistor 202 connected in series with N-channel transistor 204 between node N3 and circuit ground. Another P-channel transistor 206 in series with N-channel transistor 208 also couples node N3 to circuit ground.

The gate terminal of transistor 204 is coupled to node N1 and node N1 is coupled through an inverter 210 to the gate terminal of transistor 208 defining node N2. The point intermediate transistors 202 and 204 defines node N4 which is connected to the gate terminal of transistor 206. Similarly, the point intermediate transistors 206 and 208 defines node, N5 which is connected to the gate terminal of transistor 202.

The circuit 200 provides a means of level shifting voltages. Assuming the following conditions:

$V_{MAX}$(N1)=the maximum voltage on node N1=power supply #1;

V(N3)=voltage on node N3=power supply #2;

$V_{MAX}$(N1)<V(N3)

The supply voltage for inverter 210=$V_{MAX}$(N1) For the condition of V(N1)=0.0 volts, V(N2)=$V_{MAX}$(N1) and transistors 206 and 204 are "off" and transistors 202 and 208 are "on". Thus, node V(N4)=V(N3) and V(N5)=VSS.

In operation, when node N1 is taken "high" such that V(N1)=$V_{MAX}$(N1), Node N4 tries to go "low" ([[VSS]]) $V_{SS}$ through transistor 204. Because transistor 202 is still "on", node N4 is temporarily in contention. Note that transistor 204 is typically sized to be larger than transistor 202 such, that the former will dominate. Once node N2 goes "low", transistor 208 turns "off" and node N5 is temporarily un-driven until node N4 is pulled "low" enough to turn "on" transistor 206. As node N5 starts to rise, transistor 202 turns "off" and node N4 goes to ground. Node N5 then goes to a V(N3) level. It should be noted that the same "fight" condition exists on node N5 when switching node N1 from "high" to "low".

Figure 3:
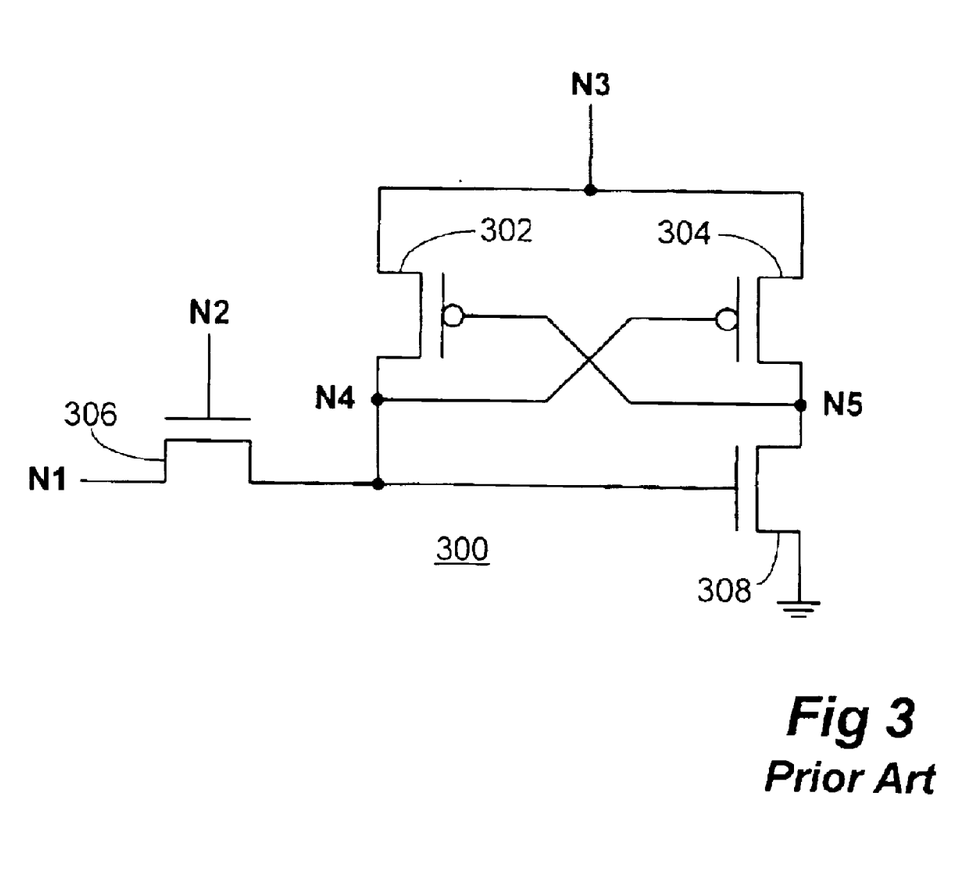
FIG. 3 is a schematic diagram of yet another prior art voltage level shifting circuit.

With reference additionally now to FIG. 3, another existing type of voltage level shifting circuit 300 is shown. The circuit 300 comprises P-channel transistor 302 connected between node N3 ,and a node N4. Another P-channel transistor 304 in series with N-channel transistor 308 couples node N3 to circuit ground. An N-channel transistor 306 couples node N1 to node N4 and has its gate terminal coupled to node N2. The gate terminal of transistor 308 is coupled to node N4 and to the gate terminal of transistor 304. The point intermediate transistors 304 and 308 defines node N5 which is connected to the gate terminal of transistor 302.

In the operation of circuit 300, the gate terminal of transistor 306 (node N2) is tied to a $V_{MAX}$(N1) supply level. For the initial condition where V(N1)=0.0 volts; V(N4)=0.0 volts and V(N5)=V(N3)=power supply #2 level, when V(N1) is taken "high" such that V(N1)=$V_{MAX}$(N1), node N4 starts to rise. As node N4 rises, transistor 308 turns "on" which pulls node N5 "low", which in turn, causes transistor 302 to turn "on" which pulls up node N4 until V(N4)=V(N3). At this point, transistor 306 is "off".

With V(N4)=V(N3) and V(N5)=0.0 volts, if V(N1) is pulled "low", transistor 306 turns "on" and node N4 tries to go "low". However, because transistor 306 is still "on", node N4 moves "low" slowly until transistor 308 turns "off" and transistor 304 turns "on". As node N5 moves due to transistor 304 turning "on", transistor 302 turns "off" and node N4 goes "low". Because of this "fight" condition between transistors 302 and 306, this method of level shifting is slower in one direction (V(N1) "high" to "low") than the other. It should be noted that the gate connection of transistor 308 can be connected to Node N1 with the same resultant circuit 300 performance.

Figure 4:
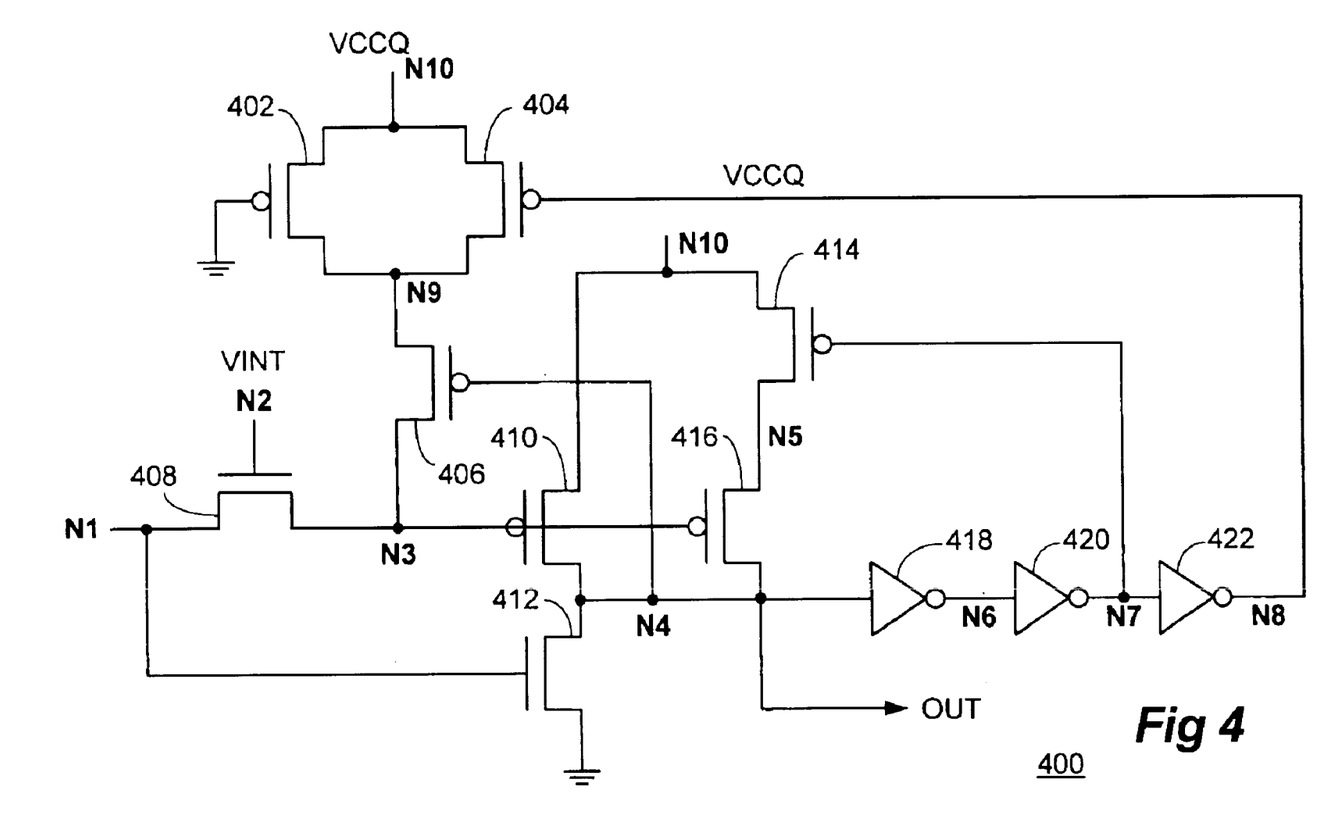
FIG. 4 is a schematic diagram of a voltage level shifting circuit in accordance with a representative embodiment of the present invention.

With reference additionally now to FIG. 4, a voltage level shifting circuit 400 in accordance with a representative embodiment of the present invention is shown. In the particular implementation illustrated, Node N1 is connected to the drain terminal of N-channel transistor 408 and the gates terminal of N-channel transistor 412. Node N2 is connected to the gate terminal of transistor 408. Node N3 is connected to the source terminal of transistor 408, the gate terminal of P-channel transistor 410 and the drain terminal of P-channel transistor 406 as well as the gate terminal of P-channel transistor 416.

Node N4 is connected to the drain terminal of transistor 410, the drain terminal of transistor 416, the drain terminal of transistor 412, the gate terminal of transistor 406 and the input of inverter 418. Node N5 is connected to the source terminal of transistor 416 and the drain terminal of P-channel transistor 414. Node N6 is connected to the output of inverter 418 and the input of inverter 420. Node N7 is connected to the output of inverter 420, the input of inverter 422 and the gate terminal of transistor 414. Node N8 is connected to the output of inverter 422 and the gate terminal of P-channel transistor 404. Node N9 is connected to the source terminal of transistor 406, the drain terminal of P-channel transistor 402 and the drain terminal of transistor 404. Node N10 is the supply node and is connected to the source terminals of transistors 402, 404, 410 and 414. It should be noted that the inverters 418, 420 and 422 are all supplied from node N10. Node N2,is from the lower level supply.

In operation, the circuit 400 functions as follows:

Initial Conditions: A steady state condition is assumed with V(N1)=ground, V(N3)=ground and transistor 410 is "on". Transistor 412 is "off" and node N4 is "high" (e.g. V(N10) level), node N6 is "low" and node N7 is "high". Thus, transistor 414 is "off" and node N8 is "low". Transistor 404 is "on" as is transistor 402 and, by design, transistor 402 is made much smaller than transistor 404. Transistor 402 is configured to be "on" (with its gate terminal connected to circuit ground) permanently. Transistor 406 is "off".

Circuit 400 Function: When node N1 transitions from "low" (circuit ground) to "high" ($V_{MAX}$(N1)), transistor 412 turns "on" and node N3 starts to rise. Because transistor 408 is configured as a source follower, node N3 rises to within an $N_{VT}$ (N-channel device threshold voltage) of node N2, at which point transistor 408 starts to turn "off". With node N3 rising, transistor 410 starts turning "off" also. Node N4 goes "low" which turns "on" transistor 406, which in turn, pulls node N3 to the V(N10) level, which shuts "off" transistor 410 entirely. Note that transistor 416 tracks the functionality of transistor 410, thus, transistor 416 turns "off" also. As node N4 goes "low", node N6 goes "high", and node N7 goes "low" which turns "on" transistor 414 and brings node N5 "high". Node N7 going "low" causes node N8 to go "high" which turns "off" transistor 404. Thus, node N3 is held "high" through transistors 402 and 406.

When node N1 transitions from "high" to "low", transistor 412 turns "off" and transistor 408 turns "on" and node N3 starts to go "low". Because transistor 402 is sized to be small, node N3 is able to follow node N1 "low" quite easily with minimal delay. As node N3 turns "low", transistor 410 turns "on" and node N4 goes "high" which turns "off" transistor 406 and allows node N3 to go all the way to circuit ground. After two delay periods through inverters 418 and 420, node N7 goes "high" turning "off" transistor 414. One delay period later due to inverter 422, node N8 goes "low" turning transistor 404 "on" and the cycle is complete. It should be noted that transistor 410 is sized to be smaller than transistor 416. Node N4 defines the output ("OUT")of the circuit 400.

As can be seen, the circuit of the present invention advantageously provides a means for level shifting from a lower supply voltage to a higher supply voltage with minimum speed impact.

Figure 5A:
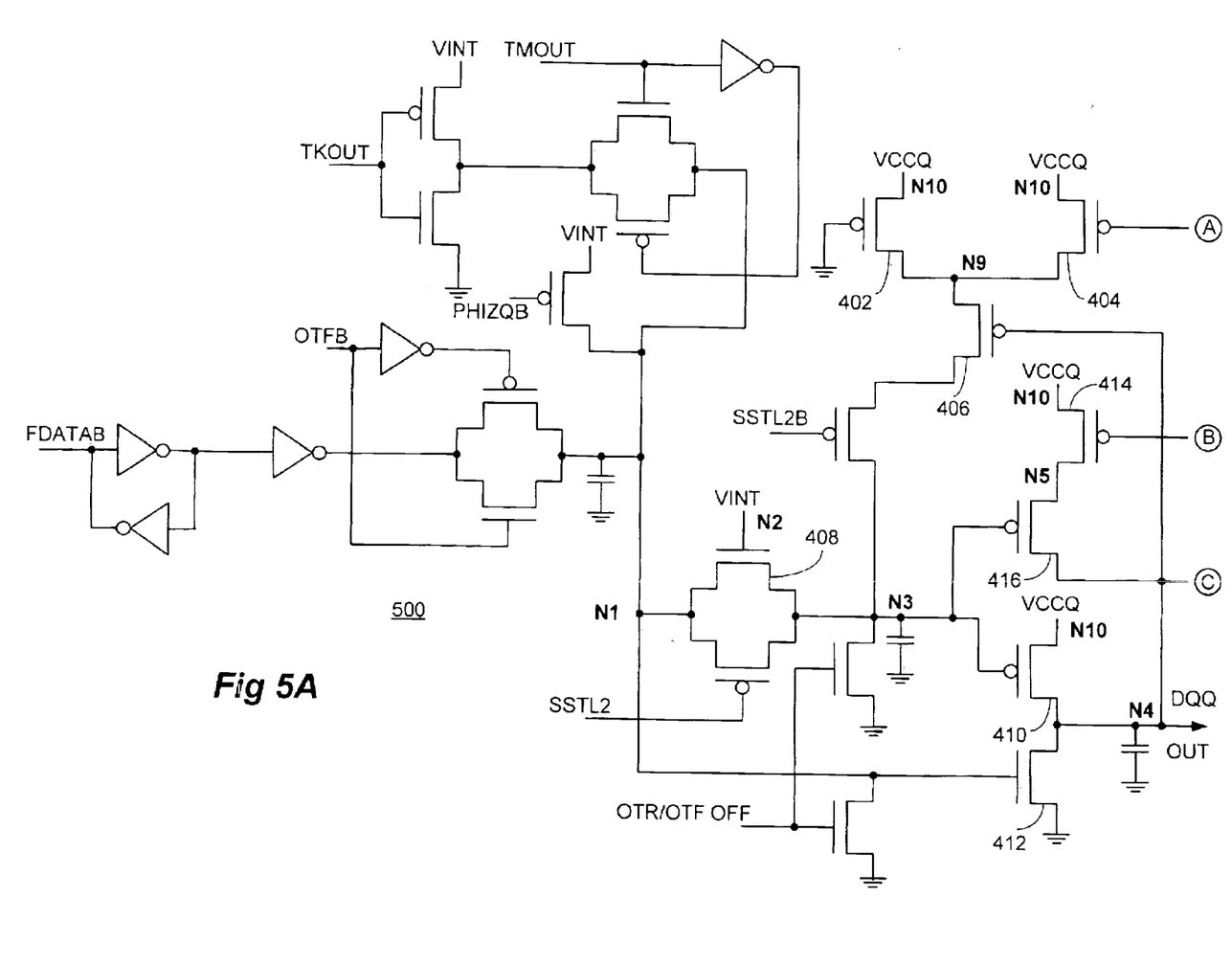
FIGS. 5A and 5B together comprise a schematic diagram of a particular implementation of a data output buffer for a dynamic random access memory ("DRAM") device incorporating a voltage level shifting circuit in accordance with the embodiment of the preceding figure.
Figure 5B:
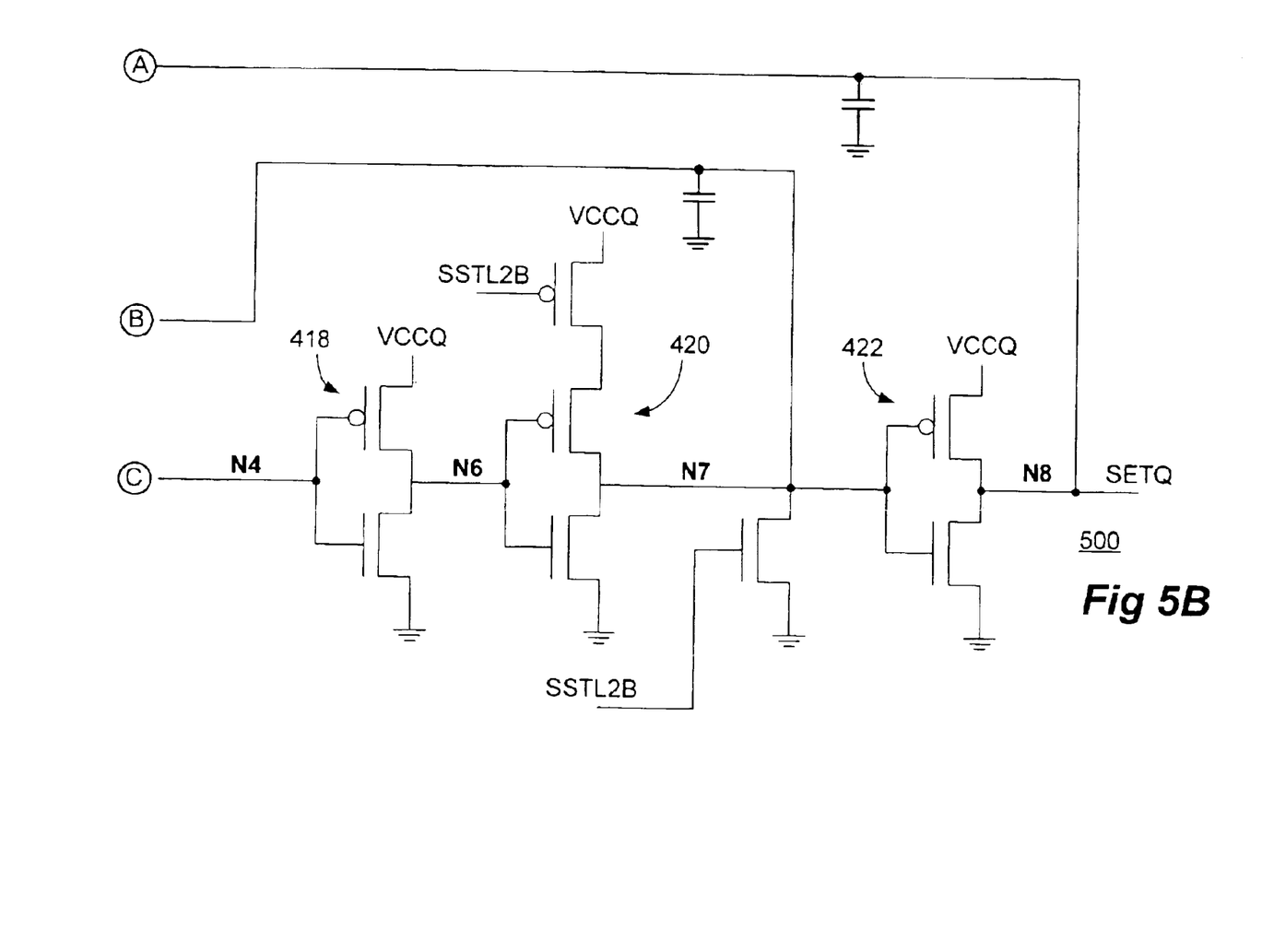

With reference additionally now to FIGS. 5A and 5B, a schematic diagram of a particular implementation of a data output buffer 500 is shown for use in a DRAM device incorporating a voltage level shifting circuit in accordance with the embodiment of the preceding figure. As illustrated, like structure to that previously described with respect to FIG. 4 is like numbered and the foregoing description thereof shall suffice herefor.

In this particular implementation, Node N2 ([[VINT]]) $V_{INT}$ is the lower level supply voltage, or supply #1 while node N10 ([[VCCQ]])$V_{CCQ}$ is the higher level supply voltage, or supply #2. Representative device sizes for the various transistors comprising the voltage level shifting circuit of the output buffer 500 shown are: transistor 402 (W/L=1.0 μ/0.26 μ); transistor 404 (W/L=12.0 μ/0.26 μ); transistor 406 (W/L=8.0 μ/0.26 μ); transistor 408 (W/L=5.0 μ/0.27 μ); transistor 410 (W/L=2.0 μ/0.26 μ); transistor 412 (W/L=15.0 μ/0.22 μ); transistor 414 (W/L=100.0 μ/0.26 μ) and transistor 416 (W/L=30.0 μ/0.26 μ).

While there have been described above the principles of the present invention in conjunction with specific circuit layouts and devices types, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any, generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What claimed is:

1. A voltage level shifting circuit having first and second supply voltage level inputs thereto, said voltage level shifting circuit comprising:
   a first switching device coupling a first circuit node to a second circuit node, said first switching device having a control terminal thereof coupled to said first supply voltage level input;
   second and third switching devices coupled between said second supply voltage level input and a third circuit node;
   a fourth switching device coupled between said third circuit node and said second circuit node;
   fifth and sixth series coupled switching devices coupled between said second supply voltage level input and a reference voltage input and defining a fourth circuit node therebetween, a control terminal of said fifth switching device being coupled to said second circuit node and a control terminal of said sixth switching device being coupled to said first circuit node;
   seventh and eighth series coupled switching devices coupled between said second supply voltage level input and said fourth circuit node, a control terminal of said eighth switching device being coupled to said second circuit node;
   a first circuit delay block coupling said fourth circuit node to a control terminal of said seventh switching device; and
   a second circuit delay block coupling said control terminal of said seventh switching device to a control terminal of said third switching device.

2. The circuit of claim 1 wherein said first through eighth switching devices comprise MOS transistors.

3. The circuit of claim 1 wherein said first switching device comprises an N-channel transistor.

4. The circuit of claim 1 wherein said second and third switching devices comprise P-channel transistors.

5. The circuit of claim 1 wherein said fourth and fifth switching devices comprise P-channel transistors.

6. The circuit of claim 1 wherein said sixth switching device comprises an N-channel transistor.

7. The circuit of claim 1 wherein said seventh and eighth switching devices comprise P-channel transistors.

8. The circuit of claim 1 wherein said second and third switching devices comprise MOS transistors with said second switching device being smaller than said third switching device.

9. The circuit of claim 1 wherein said fifth and eighth switching devices comprise MOS transistors with said fifth switching device being smaller than said eighth switching device.

10. The circuit of claim 1 wherein said first circuit delay block comprises at least one inverter.

11. The circuit of claim 1 wherein said second circuit delay block comprises at least one inverter.

12. The circuit of claim 1 wherein said second switching device comprises a control terminal coupled to said reference voltage input.

13. The circuit of claim 1 wherein said first circuit node defines an input to said voltage level shifting circuit and said fourth circuit node defines an output of said voltage level shifting circuit.

14. The circuit of claim 1 wherein a first voltage supplied to said first supply voltage level input is less than or equal to a second voltage supplied to said second supply voltage level input.

15. A voltage level shifting circuit comprising:
   an input circuit coupled to an input node, a lower level supply node, and an intermediate node;
   a switching circuit coupled to the intermediate node, a higher level supply node, and an output node;
   a first delay circuit having an input coupled to the output node and an output;
   a second delay circuit having an input coupled to the output of the first delay circuit, and an output;
   a first bias circuit coupled to the higher level supply node, the output of the second delay circuit, and the intermediate node; and
   a second bias circuit coupled to the higher level supply node, the output of the first delay circuit, and the output node,
   wherein the input circuit comprises an N-channel transistor having a gate coupled to the lower level supply node, and a current path coupled between the input node and the intermediate node.

16. The voltage shifting circuit of claim 15 in which the first delay circuit comprises first and second serially-coupled inverter stages.

17. The voltage shifting circuit of claim 15 in which the second delay circuit comprises an inverter stage.

18. A voltage level shifting circuit comprising:
   an input circuit coupled to an input node, a lower level supply node, and an intermediate node;
   a switching circuit coupled to the intermediate node, a higher level supply node, and an output node;

a first delay circuit having an input coupled to the output node and an output;

a second delay circuit having an input coupled to the output of the first delay circuit, and an output;

a first bias circuit coupled to the higher level supply node, the output of the second delay circuit, and the intermediate node; and a second bias circuit coupled to the higher level supply nodes the output of the first delay circuit, and the output node, wherein the switching circuit comprises a P-channel transistor having a source coupled to the higher level supply node, a gate coupled to the intermediate node, and a drain coupled to the output node, and an N-channel transistor having a drain coupled to the output node, a gate coupled to the input node, and a source coupled to ground.

19. The voltage shifting circuit of claim 18 in which the first delay circuit comprises first and second serially-coupled inverter stages.

20. The voltage shifting circuit of claim 18 in which the second delay circuit comprises an inverter stage.

21. A voltage level shifting circuit comprising:

an input circuit coupled to an input node, a lower level supply node, and an intermediate node;

a switching circuit coupled to the intermediate node, a higher level supply node, and an output node;

a first delay circuit having an input coupled to the output node and an output;

a second delay circuit having an input coupled to the output of the first delay circuit, and an output;

a first bias circuit coupled to the higher level supply node, the output of the second delay circuit, and the intermediate node; and a second bias circuit coupled to the higher level supply node, the output of the first delay circuit, and the output node, wherein the first bias circuit comprises a first P-channel transistor having a source coupled to the higher level supply node, a gate coupled to ground, and a drain, a second P-channel transistor having a source coupled to the higher level supply node, a gate coupled to the output of the second delay circuit, and a drain, and a third P-channel transistor having a source coupled to the drains of the first and second P-channel transistors, a gate coupled to the output node, and a drain coupled to the intermediate node.

22. The voltage shifting circuit of claim 21 in which the first delay circuit comprises first and second serially-coupled inverter stages.

23. The voltage shifting circuit of claim 21 in which the second delay circuit comprises an inverter stage.

24. A voltage level shifting circuit comprising:

an input circuit coupled to an input node, a lower level supply node, and an intermediate node;

a switching circuit coupled to the intermediate node, a higher level supply node, and an output node;

a first delay circuit having an input coupled to the output node and an output;

a second delay circuit having an input coupled to the output of the first delay circuit, and an output;

a first bias circuit coupled to the higher level supply node, the output of the second delay circuit, and the intermediate node; and a second bias circuit coupled to the higher level supply node, the output of the first delay circuit, and the output node, wherein the second bias circuit comprises a first P-channel transistor having a source coupled to the higher level supply node, a gate coupled to the output of the first delay circuit, and a drain; and a second P-channel transistor having a source coupled to the drain of the first P-channel transistor, a gate coupled to the intermediate node, and a drain coupled to the output node.

25. The voltage shifting circuit of claim 24 in which the first delay circuit comprises first and second serially-coupled inverter stages.

26. The voltage shifting circuit of claim 24 in which the second delay circuit comprises an inverter stage.

* * * * *

UNITED STATES PATENT AND TRADEMARK OFFICE
CERTIFICATE OF CORRECTION

PATENT NO. : 6,768,367 B1
DATED : July 27, 2004
INVENTOR(S) : Harold Brett Meadows and Jon Allan Faue It is certified that error appears in the above-identified patent and that said Letters Patent is hereby corrected as shown below:

Title page,
Item [57], ABSTRACT,
Line 6, "speeds" should be -- speed --
Item [73], Assignee, should be -- ProMOS Technologies Inc., Hsinchu (TW) --

Column 7,
Line 9, after node should be -- , --

Signed and Sealed this

Twenty-second Day of February, 2005

JON W. DUDAS
*Director of the United States Patent and Trademark Office*